(12) United States Patent
Noguchi

(10) Patent No.: US 8,773,074 B2
(45) Date of Patent: *Jul. 8, 2014

(54) BATTERY, BATTERY SYSTEM AND METHOD FOR DETECTING ABNORMAL STATE OF BATTERY

(71) Applicant: Empire Technology Development LLC, Wilmington, DE (US)

(72) Inventor: Masakatsu Noguchi, Tokyo (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/834,941

(22) Filed: Mar. 15, 2013

(65) Prior Publication Data

US 2013/0200854 A1    Aug. 8, 2013

Related U.S. Application Data

(63) Continuation of application No. 12/644,660, filed on Dec. 22, 2009, now Pat. No. 8,427,111.

(30) Foreign Application Priority Data

Dec. 22, 2009  (JP) ................................ 2009-290427

(51) Int. Cl.
 *H02J 7/00*     (2006.01)
 *H01M 2/00*     (2006.01)
 *H01M 10/48*    (2006.01)

(52) U.S. Cl.
 USPC ............. 320/134; 320/112; 320/128; 429/61; 429/90

(58) Field of Classification Search
 USPC .......... 320/128, 132, 134–136, 112; 324/426, 324/434; 429/61, 90, 91; 702/63
 See application file for complete search history.

(56) References Cited

U.S. PATENT DOCUMENTS 8,097,352 B2 *  1/2012  Fuse ............................... 429/90
8,427,111 B2 *  4/2013  Noguchi ....................... 320/134

FOREIGN PATENT DOCUMENTS

| JP | 2000-048861 | 2/2000 |
| JP | 2001-215157 | 8/2001 |
| JP | 2008-310991 | 12/2008 |
| JP | 2009-110756 | 5/2009 |

OTHER PUBLICATIONS

"Visualization Technology for 'Invisible' Danger—Diagnosing damages in structures and their danger level at the same time using elastico-luminescent materials-;" Japanese version downloaded on Dec. 13, 2012 from https://ct.nishipla.or.jp/site/pdf/36.t_shingijutsuseminar/200501.pdf; English translation downloaded on Dec. 13, 2012 from http://www.aist.go.jp/aist_e/latest_research/2009/20090107/20090107.html., 10 pp.

(Continued)

*Primary Examiner* — Richard V Muralidar

(74) *Attorney, Agent, or Firm* — Foley & Lardner LLP

(57) ABSTRACT

There is provided a battery system including a battery having a luminescent layer on surfaces of an exterior member, the luminescent layer containing a stress luminescent material that emits light in response to application of mechanical stress, a photodetector device that detects light emission by the stress luminescent material, and abnormality detection means for monitoring the light emission detected by the photodetector device and thus detecting an abnormality in the battery.

20 Claims, 7 Drawing Sheets

(56) References Cited

OTHER PUBLICATIONS

"Visualization Technology for 'Invisible' Danger, -Diagnosing damages in structures and their danger level at the same time using elastico-luminescent materials," Translation of AIST press release of Nov. 14, 2008. Downloaded from http://www.aist.go.jp/aist_e/latest_research/2009/20090107/20090107.html., 3 pp.

Ahlberg, L., "Can you see me now? Flexible photodetectors could help sharpen photos," (Jan. 13, 2009), downloaded on Dec. 12, 2012 at http://www.news.wis.edu/16126, 2 pp.

Decision of Rejection for JP 2009-290427, mailed Jun. 11, 2010, 3 pp. (with English translation).

Notice of Reasons for Rejection for JP 2009-290427, mailed Feb. 19, 2010, 4 pp. (with English translation).

Non-final Office Action for U.S. Appl. No. 12/644,660, mailed on Jun. 12, 2012, 12 pp.

Notice of Allowance issued for U.S. Appl.No. 12/644,660, mailed on Dec. 21, 2012, 12 pp.

Someya Lab Archive Download on Dec. 13, 2012 from http//www.ntech.t.u-tokyo.ac.jp/Archive/Archive_download/Archive_download.html, 3 pp.

Xu, C-N, "Hybrid Materials of Mechanoluminescence," (2004), vol. 39, No. 2, pp. 130-133. (Abstract Only, 1 page).

\* cited by examiner

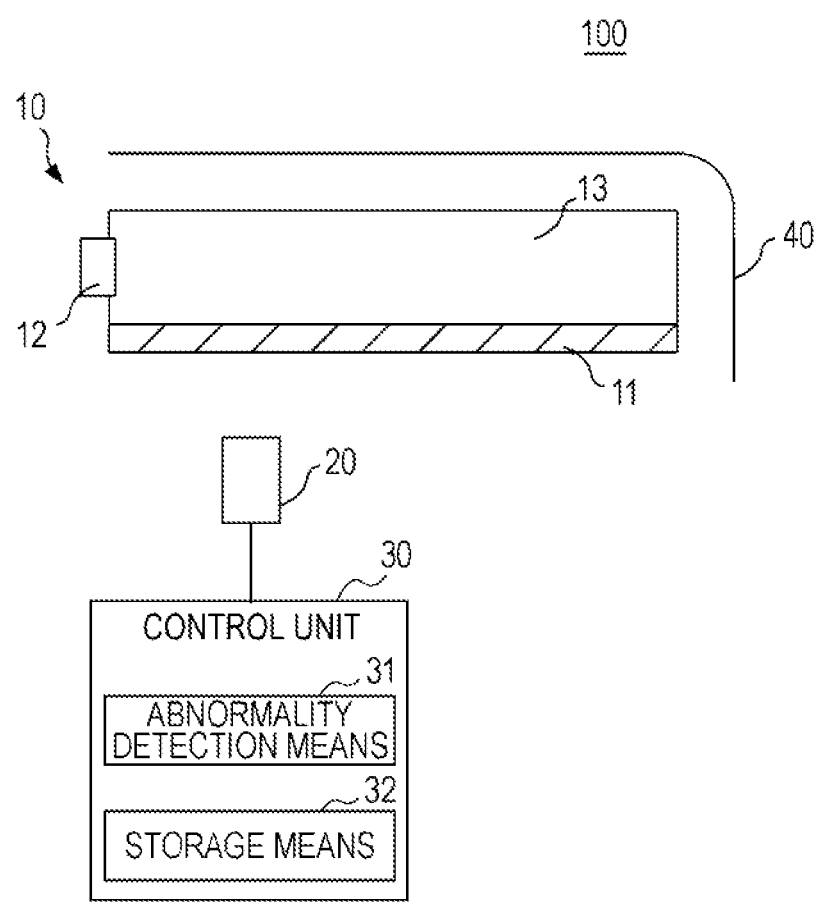

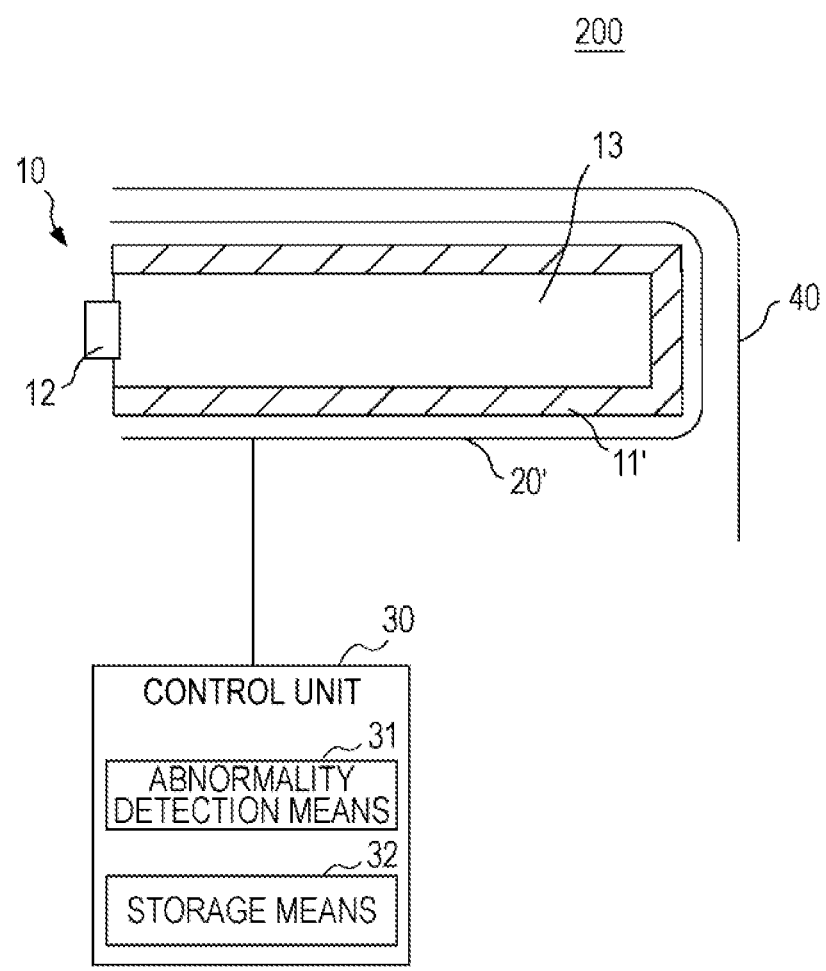

BATTERY, BATTERY SYSTEM AND METHOD FOR DETECTING ABNORMAL STATE OF BATTERY

CROSS REFERENCE TO RELATED APPLICATION

This application is a continuation of U.S. patent application Ser. No. 12/644,660, filed Dec. 22, 2009, which claims the benefit of Japanese Patent Application No. 2009-290427 filed on Dec. 22, 2009, the entire contents of each of which are incorporated herein by reference in their entireties.

BACKGROUND

1. Technical Field

The present disclosure relates to a battery, a battery system, and a method for detecting state of battery.

2. Related Art

In recent years, batteries (storage batteries) such as secondary batteries and capacitors have been developed and have been widely used as power supplies for various electric appliances. The demands for increases in capacitance of batteries, that is, the demand for increases in output have been increased with the increase in expectation for the use of the batteries as power supplies for large hybrid electric vehicles and electric vehicles.

In order to meet such demands, schemes have been devised which increase the energy densities of electrode materials used in a battery and allow high-density packaging of the electrode materials. However, as the energy densities of the electrode materials increase, the frequency that abnormal heating occurs increases and thus the risk of the battery increases. Therefore, safety measures for safe use of the battery are more important.

The safety measures in the past include precise control over charge/discharge to/from a battery for preventing overdischarge or overcharge, for example, and processing on an electric circuit therein of using a thermistor to measure the temperatures of the battery and turning off the circuit when the battery is overheated. (for example, refer to patent document 1 below).

Patent document 1: Japanese Unexamined Patent Application Publication No. 2000-048861.

SUMMARY

However, the safety measures in the past to be performed on an electric circuit have a problem that it is difficult to prevent and warn accidents owing to a thermal runaway reaction caused by internal short circuits in batteries or other abnormal chemical reactions.

Accordingly, there have been demanded an inventive battery system and abnormality detection method for a storage battery which can prevent and warn the accidents.

According to an aspect of the present disclosure, there is provided a battery having a luminescent layer on surfaces of an exterior member thereof, the luminescent layer containing a stress luminescent material that emits light in response to application of mechanical stress.

According to another aspect of the present disclosure, there is provided a battery system including the battery, a photodetector device that detects light emission by the stress luminescent material, and abnormality detection means for monitoring the light emission detected by the photodetector and thus detecting an abnormality in the battery.

In the battery system of the present disclosure, the abnormality detection means may continuously monitor the light emission by the stress luminescent material while the battery is being charged and intermittently monitor the light emission by the stress luminescent material while the battery is being discharged.

In the battery system of the present disclosure, the abnormality detection means may compare between the monitored light emission pattern and a prepared light emission pattern of the stress luminescent material when the battery is abnormal and thus detect an abnormality in the battery.

In the battery system of the present disclosure, the luminescent layer may be formed on only one of the surfaces of the exterior member.

In the battery system of the present disclosure, the luminescent layer may be formed on entire surfaces of the exterior member excluding an electrode portion of the battery.

In the battery system of the present disclosure, the luminescent layer may be formed in a predetermined pattern on the surfaces of the exterior member.

In the battery system of the present disclosure, the photodetector may be arranged to face the luminescent layer.

In the battery system of the present disclosure, the photodetector device may have a form following a surface of the luminescent layer.

In the battery system of the present disclosure, the battery may be a vehicle battery to be mounted in a vehicle.

According to another aspect of the present disclosure, there is provided an abnormality detection method that detects an abnormality in a battery in a battery system, the battery system including the battery having a luminescent layer on surfaces of an exterior member thereof, the luminescent layer containing a stress luminescent material that emits light in response to application of mechanical stress, and a photodetector device that is arranged to face the luminescent layer and detects light emission by the stress luminescent material, the method comprising: monitoring the light emission detected by the photodetector device, and comparing between the monitored light emission pattern and a prepared light emission pattern of the stress luminescent material when the battery is abnormal and thus detecting an abnormality in the battery.

BRIEF DESCRIPTION OF THE DRAWINGS

FIG. 1 illustrates a schematic configuration of a battery system according to a first embodiment of the present disclosure;

FIG. 6 illustrates a schematic configuration of a battery system of the second embodiment of the present disclosure.

DETAILED DESCRIPTION

Figure 2A:
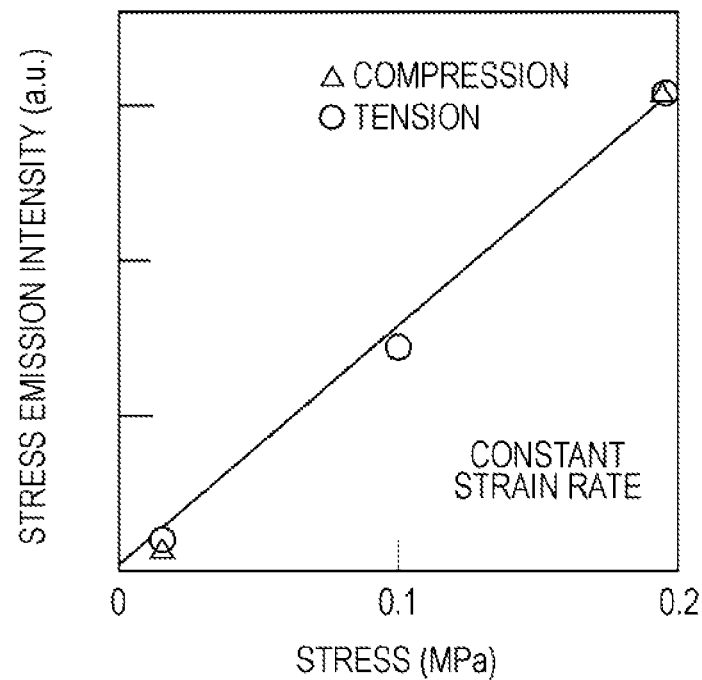
FIG. 2A illustrates stress dependency against stress emission intensity.

There will be described preferred embodiments for implementing the present disclosure with reference to drawings, hereinafter. A battery in the description of the embodiments is a lithium ion battery, for example. The illustrated sizes of and positional relationships between the components may be exaggerated for clarity.

[First Embodiment]

FIG. 1 illustrates a schematic configuration of a battery system 100 according to a first embodiment of the present disclosure.

The battery system 100 includes a lithium ion battery 10, a photodetector device 20 and a control unit 30.

The lithium ion battery 10 includes a positive pole, a negative pole, a separator, electrolyte allowing ions to move between the positive pole and the negative pole, and an exterior member (such as an aluminum laminated member) that externally leads terminals extending from the positive pole and negative pole and accommodates them. The lithium ion battery 10 of this embodiment includes, as illustrated in FIG. 1, a luminescent layer 11 containing a stress luminescent material on a part of surfaces (which will be called external portion) 13 of the exterior member excluding the part having an electrode portion 12 with its terminal led externally. The configuration and functions of the lithium ion battery 10 may be common to lithium ion batteries in the past excluding the luminescent layer 11. The lithium ion battery 10 may be accommodated in an outer case 40 for protecting the battery itself from external loads such as impact.

Figure 2B:
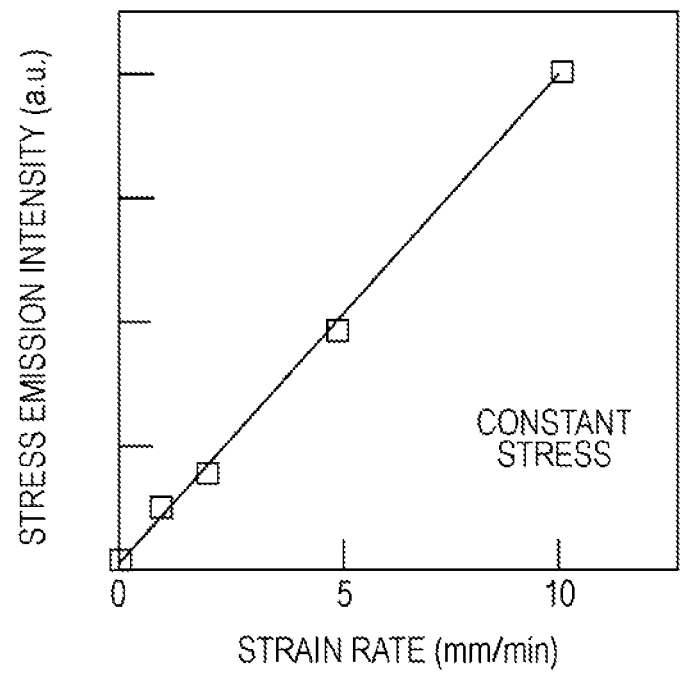
FIG. 2B illustrates strain rate dependency against stress emission intensity.

The luminescent layer 11 may be formed by uniformly applying a coating containing a stress luminescent material that emits light in response to application of mechanical stress to a predetermined part of the external portion 13, such as one surface of the external portion 13, as illustrated in FIG. 1. The predetermined part is not limited to one surface of the external portion 13. Since the emission intensity of a stress luminescent material is proportional to the absolute value of a stress and the speed of distortion (as illustrated in FIGS. 2A and 2B), the predetermined part may be a part subject to a stress caused when the external portion 13 is distorted in response to an abnormality in the lithium ion battery 10, for example. FIG. 2A illustrates stress dependency against stress emission intensity, and FIG. 2B illustrates strain rate dependency. (Refer to https://ct.nishipla.or.jp/site/pdf/36.t_shingijutsuseminar/200501.pdf). The luminescent layer 11 may be formed by, for example, causing the stress luminescent material itself to adhere to the surface by a method such as sputtering, without limiting to the formation by uniformly applying the coating.

Figure 3:
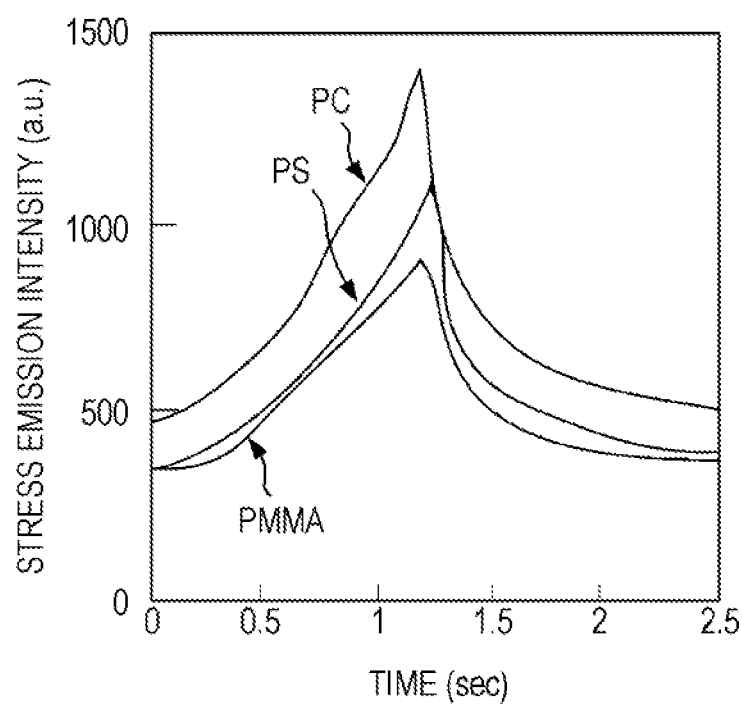
FIG. 3 is a relational diagram of stress emission intensity in a composite film of the stress luminescent material and a transparent resin.

The stress luminescent material of this embodiment is strontium aluminate ($SrAl_2O_2$:Eu) powder containing europium with high luminosity. When the material is used as the coating, it has been known that a composite film of europium with a concentration of 4% and a transparent resin (such as polycarbonate (PC), polystyrene (PS) and polymethylmethacrylate (PMMA)) can provide good light emission. FIG. 3 is a relational diagram of stress emission intensity in a composite film of the stress luminescent material and a transparent resin (cited from New Energy and Industrial Technology Development Organization, FY 2005 Research Report of NEDO-grant). The stress luminescent material may be, without limiting to the material, a material that emits light when the external portion 13 of the lithium ion battery 10 is distorted or the pressure thereon increases.

The photodetector device 20 is arranged to face the luminescent layer 11 of the lithium ion battery 10 and is a photodetector (such as photodetector diode) that detects the light emission by the stress luminescent material. The light-emission signal converted by the photodetector device 20 is processed by the control unit 30. In order to detect light emission at a plurality of parts of the luminescent layer 11, a plurality of photodetector devices 20 may be provided, without limiting to one device. The photodetector device 20 converts light to an electric signal (light-emission signal). Since the configuration and function may be common to general photodetectors, the detail description will be omitted. The photodetector device 20 may be arranged at an arbitrary position where the photodetector device 20 can detect the light emission by the luminescent layer 11, without the arrangement to face the luminescent layer 11 of the lithium ion battery 10.

The control unit 30 includes abnormality detection means 31 and storage means 32. The control unit 30 may be implemented by a general microchip, for example.

The abnormality detection means 31 receives the light-emission signal from the photodetector device 20 to monitor the light emission detected by the photodetector device 20 and detects an abnormality in the lithium ion battery 10. While the battery 10 is being charged, the abnormality detection means 31 continuously monitors the light emission detected by the photodetector device 20. While the lithium ion battery 10 is being discharged, the abnormality detection means 31 intermittently monitors the light emission detected by the photodetector device 20. The monitoring by the abnormality detection means 31 of the light emission detected by the photodetector during charge time or discharge time when the distortion of the lithium ion battery 10 may easily vary or the amount of stress onto the exterior member may easily increase can allow reduction of power consumption required for the monitoring and provide the security while the lithium ion battery 10 is being used. Since power is being continuously supplied while the lithium ion battery 10 is being charged, the continuous monitoring of the light emission detected by the photodetector device 20 can improve the security while the lithium ion battery 10 is being used.

While the lithium ion battery 10 is being discharged, the abnormality detection means 31 intermittently monitors the light emission detected by the photodetector device 20 at predetermined intervals according to the load current value during the discharge time. For example, when the lithium ion battery 10 is discharged with the load current value equal to or higher than 0.3 C (where 1 C refers to the current value with which the constant-current discharge of a battery having a capacity of a normal capacity value completes just one hour 1), the abnormality detection means 31 monitors the detection at least at a frequency of once per second. When the lithium ion battery 10 is discharged with the load current value lower than 0.1 C, the abnormality detection means 31 may monitor the detection once per 10 seconds or may determine not to monitor. The intervals according to the load current during discharge may be predetermined as required in accordance with the capacity and characteristics of the lithium ion battery 10.

The method for detecting an abnormality in the lithium ion battery 10 by the abnormality detection means 31 may include comparing by pattern matching between the pattern of light emission acquired by the monitoring and the light emission pattern that is prestored in the storage means 32 of the stress luminescent material when the lithium ion battery 10 has an abnormality and detecting an abnormality in the lithium ion battery 10. The light emission pattern of the stress luminescent material when the lithium ion battery 10 has an abnormality may be acquired by intentionally causing an abnormality in the lithium ion battery 10 having the luminescent layer 11 in an experiment, for example. The light emission pattern prestored in the storage means 32 may be a displacement pattern of the strength of a light-emission signal during a predetermined period of time. When a plurality of photodetectors are used to detect light emission of the corresponding different parts of a stress luminescent material of the luminescent layer 11, for example, the light emission pattern may be a pattern of the frequency of occurrence of the light-emission signals. According to this embodiment, the light emission patterns when an abnormality occurs are prestored in the storage means 32, including a plurality of light emission patterns with different risk levels of an alert-required level and a disabled (or serious) level for the charge time and the discharge time. Alternatively, the light emission pattern common to the charge time and the discharge time may also be used.

When the abnormality detection means 31 detects an abnormality in the lithium ion battery 10, the abnormality detection means 31 may cause a control system that controls the lithium ion battery 10 to display an alert in accordance with, for example, the risk level of the abnormality. In this case, the lithium ion battery 10 may be stopped charging or discharging.

Figure 4:
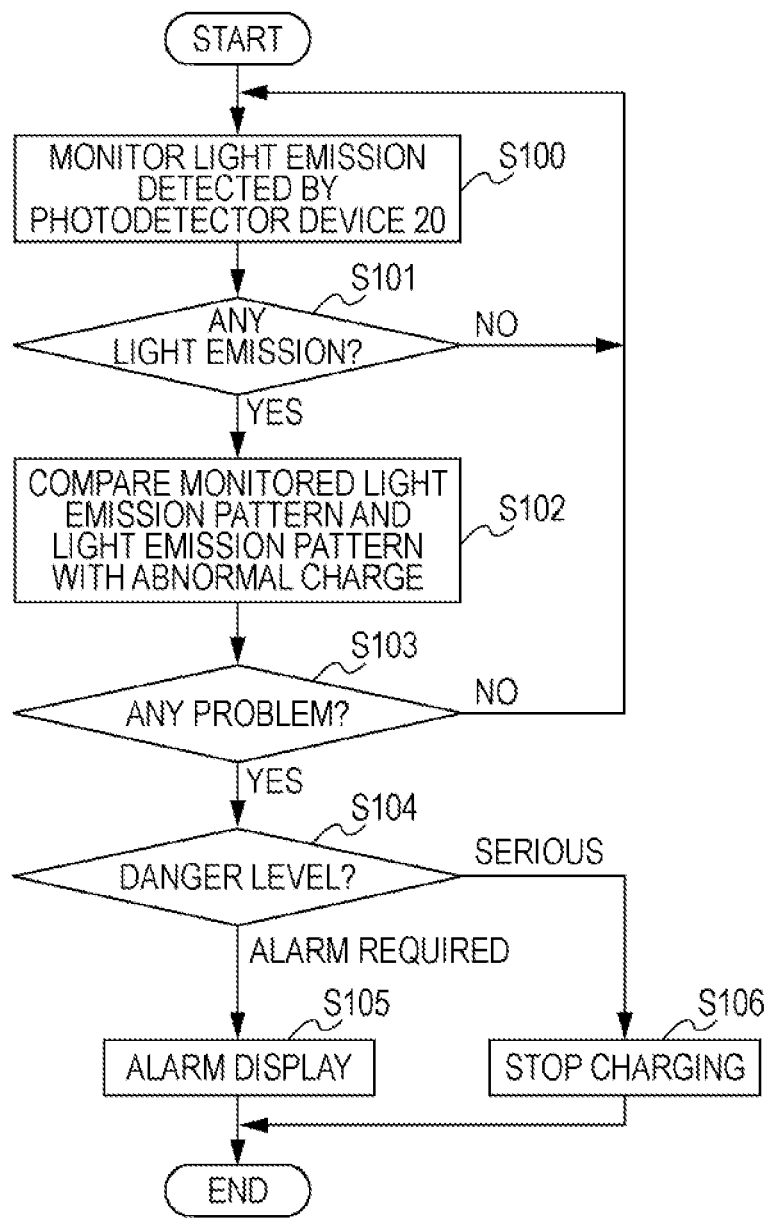
FIG. 4 is an example of the flowchart of an abnormality detection method by the battery system of the embodiment.
Figure 5:
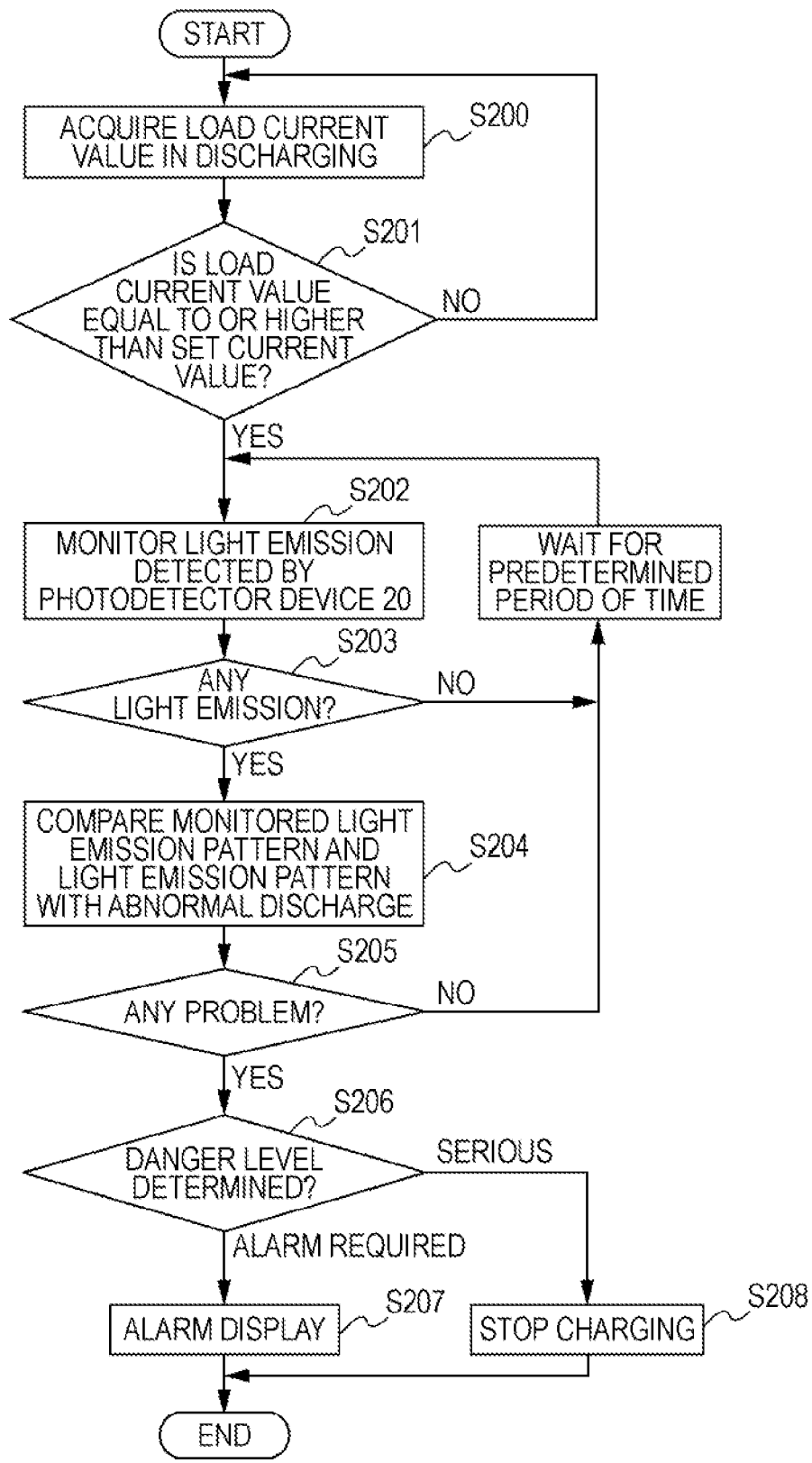
FIG. 5 is another example of the flowchart of an abnormality detection method by the battery system of the embodiment.

With reference to the flowcharts in FIGS. 4 and 5, there will be described an abnormality detection method of this embodiment to be implemented by using the battery system 100, hereinafter. FIG. 4 is a processing flowchart of an abnormality detection method while the lithium ion battery 10 is being charged. FIG. 5 is a processing flowchart of the abnormality detection method while the lithium ion battery 10 is being charged. The steps illustrated in the flow charts may be performed in an arbitrary order that the processes in the steps do not contradict each other or may be performed in parallel.

First of all, before starting the abnormality detection, the control unit 30 determines the current state of the lithium ion battery 10 between the charged state and discharging state. The current state may be determined by measuring the current flowing in the lithium ion battery 10 with an ampere meter.

There will be described the case when the lithium ion battery 10 is being charged.

First of all, as illustrated in FIG. 4, the photodetector device 20 is operated, and the abnormality detection means 31 monitors the light emission detected by the photodetector device 20 (step S100). If no light emission is detected (No in step S101), the processing returns to step S100, and the light emission detected by the photodetector device 20 is continuously monitored.

If the light emission is detected (Yes in step S101), the abnormality detection means 31 compares between the monitored light emission pattern and the light emission pattern, which is prestored in the storage means 32, of the stress luminescent material when the lithium ion battery 10 is abnormally charged (step S102). The comparison may be implemented by pattern matching between the monitored light emission pattern and a light emission pattern of the stress luminescent material in abnormal charging. More specifically, the comparison may be implemented by the pattern matching between the monitored light emission pattern and light emission pattern at the alert level and light emission pattern at the disabled (serious) level, which are stored in the storage means 32 as the light emission pattern of a stress luminescent material in abnormal charging.

If the comparison results in the determination that no problems are found in the lithium ion battery 10 (No in step S103), the processing returns to step S100. It is determined that there are no problems if the monitored light emission pattern is not matched with light patterns stored in the storage means 32 (or when a total of the differences is equal to or lower than a predetermined value, for example).

On the other hand, if the comparison results in the determination that the monitored light emission pattern is matched with the light emission pattern at the alert level against abnormal charging (Yes in step S103 and "alert required" in step S104), the abnormality detection means 31 causes the control system that controls the lithium ion battery 10 to display an alert (step S105). If the comparison results in the determination that the monitored light emission pattern is matched with the light emission pattern at the disabled level against abnormal charging (Yes in step S103 and "serious" in step S104), the abnormality detection means 31 causes the control system that controls the lithium ion battery 10 to stop charging to the lithium ion battery 10 (step S106).

Next, there will be described the case while the lithium ion battery 10 is discharging.

First of all, as illustrated in FIG. 5, the load current value in discharging is acquired, and whether the load current value is equal to or higher than a set current value or not (step S200). The set current value may be 0.1 C, for example.

If the load current value is equal to or higher than the set current value (Yes in step S201), the photodetector device 20 is operated, and the abnormality detection means 31 monitors the light emission detected by the photodetector device 20 (step S202). On the other hand, if the load current value is lower than the set current value (No in step S201), the processing returns to step S202.

If no light emission is detected (No in step S203), the processing returns to the monitoring step S202 after a predetermined interval. The predetermined interval may be determined in accordance with the load current value in discharging. With 0.3 C or higher, the interval may be one second. With a value lower than 0.3 C, the interval may be 10 seconds.

If the light emission is detected (Yes in step S203), the abnormality detection means 31 compares between the monitored light emission pattern and the light emission pattern, which is prestored in the storage means 32, of a stress luminescent material when the lithium ion battery 10 is abnormally charged (step S204). The comparison method may be similar to the one in charging.

If the comparison results in the determination that no problems are found in the lithium ion battery 10 (No in step S205), the processing returns to step S202.

On the other hand, if the comparison results in the determination that the monitored light emission pattern is matched with the light emission pattern at the alert level against abnormal charging (Yes in step S205 and "alert required" in step S206), the abnormality detection means 31 causes the control system that controls the lithium ion battery 10 to display an alert (step S207). If the comparison results in the determination that the monitored light emission pattern is matched with the light emission pattern at the disabled level against abnormal charging (Yes in step S205 and "serious" in step S206), the abnormality detection means 31 causes the control system that controls the lithium ion battery 10 to stop discharging from the lithium ion battery 10 (step S208).

The battery system and abnormality detection method for a lithium ion battery of this embodiment allows discovery of and alert against an abnormality occurring on the external portion of the lithium ion battery 10 and thus can prevent the accidents that are difficult to detect by safety measures on electric circuits.

[Second Embodiment]

A battery system 200 of a second embodiment of the present disclosure is different from the battery system 100 of the first embodiment in that the photodetector is a flexible photodetector formed along the luminescent layer 11.

FIG. 6 illustrates a schematic configuration of the battery system 200 of the second embodiment of the present disclosure. The description on the common components to those of the battery system 100 of the first embodiment will be omitted.

A luminescent layer 11' is formed by uniformly applying a coating containing a stress luminescent material to entire surfaces of the external portion 13 excluding the electrode portion 12. The luminescent layer 11' may be formed on, without limiting to the entire surfaces of the external portion 13, only one surface susceptible to stress, which is easier from the viewpoints of costs and manufacturing processes.

A photodetector device 20' is a flexible photodetector that can detect light emission in close contact with the external portion 13 and has a form following the luminescent layer 11'. The flexible photodetector may apply the one presented by University of Wisconsin-Madison (URL: http://www.news.wisc.edu/16126). The photodetector device 20' may be a flexible scanner formed by printing organic transistors, instead of the flexible photodetector. The flexible scanner may be the one presented by Tokyo University (URL: http=//www.n-tech.t.u-tokyo.ac.jp/Archive/Archive_download/Archive_download.html).

The photodetector device 20' configured by such a flexible photodetector can detect the light emission across the entire surface having the luminescent layer 11'.

Having described preferred embodiments of the present disclosure, the present disclosure is not to be limited to the embodiments. It is possible for those skilled in the art to make various changes, addition and omission thereto without departing from the claimed spirit and scope.

For example, according to the embodiments, the abnormality detection means continuously monitors the light emission detected by a photodetector while the lithium ion battery 10 is being charged and intermittently monitors the light emission detected by the photodetector while the lithium ion battery 10 is being discharged. However, the present disclosure is not limited thereto. For example, during charging, the light emission detected by a photodetector may be intermittently monitored. On the other hand, during discharging, the light emission detected by a photodetector may be continuously monitored. Alternatively, during one of charging and discharging, the light emission may be monitored.

Figure 7A:
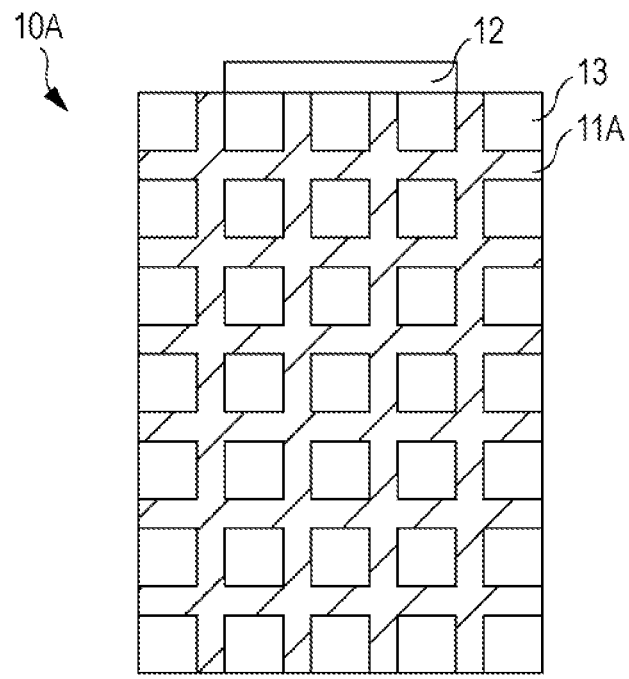
FIGS. 7A and 7B illustrate examples of the patterns of the luminescent layer on the outer cover.
Figure 7B:
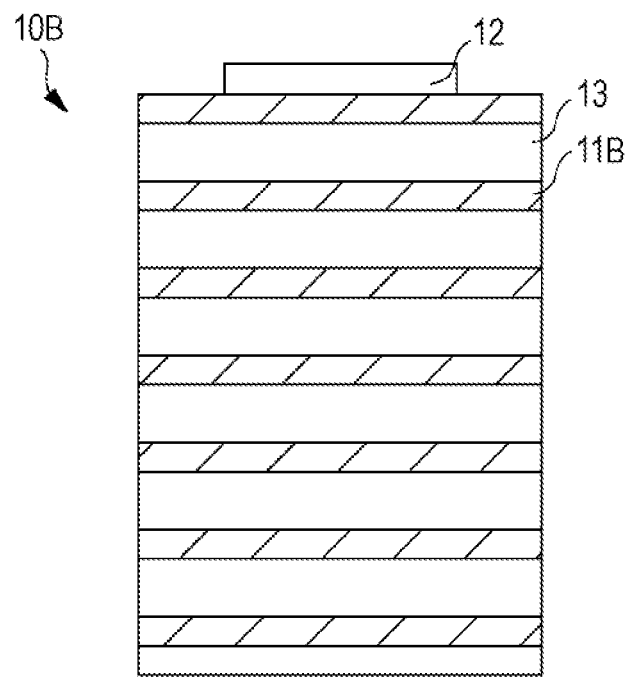

Having described, according to the embodiments, the luminescent layer is formed by applying a coating uniformly to the external surfaces, for example, the present disclosure is not limited thereto. For example, as illustrated in FIGS. 7A and 7B, the luminescent layer may be formed in a predetermined pattern on the external surfaces. FIG. 7A illustrates a mesh luminescent layer 11A on the external portion 13 of a lithium ion battery 10A. FIG. 7B illustrates a mesh luminescent layer 11B on the external portion 13 of a lithium ion battery 10B. The formed pattern allows the location of the abnormality based on the form of the light emission pattern if the external member is deformed when the lithium ion battery 10 is abnormal, in addition to the determination on whether the lithium ion battery 10 is abnormal or not.

Having described a battery system including a photodetector according to the embodiments, the present disclosure is not limited thereto. The photodetector may be omitted, and the lithium ion battery 10 alone with the luminescent layer 11 on the external portion 13 may be used. In this case, the light emission by a stress luminescent material when the lithium ion battery 10 is abnormal may be monitored visually by a user so that the presence of the abnormality can be determined. The stress luminescent material may be a material that can keep emitting light for a predetermined period of time so that the time and labor for monitoring by a user can be reduced.

Having described according to the embodiments the abnormality detection method that compares by pattern matching between the monitored light emission pattern and the light emission pattern, which is prestored in the storage means 32, of a stress luminescent material when the lithium ion battery 10 is abnormal, the present disclosure is not limited thereto. For example, an abnormal light emission pattern may be defined as a pattern beyond a predetermined emission intensity and be compared with the pattern (where whether the monitored light emission pattern has light emission beyond the predetermined emission intensity or not is determined), so that whether the battery has an abnormality or not can be detected.

One of the battery systems of the embodiments may be combined with a safeguards system to be implemented on an electric circuit in the past.

Having described according to the embodiments the lithium cell 10, for example, as the battery, the present disclosure is not limited thereto. The battery that repeats charging and discharging may be applied, and the present disclosure is applicable to secondary batteries such as nickel cadmium cells and nickel hydride batteries or capacitors such as ultracapacitors.

The present disclosure is applicable to batteries or capacitors for mobile appliances such as cellular phones and laptop PCs. The present disclosure is also applicable to batteries or capacitors for domestic use fuel cells, batteries or capacitors for smoothing outputs from environment-compatible power generating equipment such as a capacitor in combination with a solar cell, vehicle batteries to be mounted in vehicles such as hybrid electric vehicles and electric vehicles, and industrial batteries such as backup power supplies for communication base stations, for example.

What is claimed is:

1. A battery system comprising:
    a battery comprising an exterior member and a luminescent layer on a surface of the exterior member, wherein the luminescent layer comprises a stress luminescent material configured to emit light in response to application of mechanical stress;
    a photodetector device configured to detect light emission by the stress luminescent material; and
    an abnormality detection mechanism configured to monitor the light emission detected by the photodetector device, and to detect an abnormality in the battery based on the monitored light emission.

2. The battery system of claim 1, wherein the abnormality detection mechanism is further configured to compare the monitored light emission to a predetermined light emission pattern of the stress luminescent material.

3. The battery system of claim 2, wherein the abnormality detection mechanism is configured to detect the abnormality in the battery when the monitored light emission substantially matches the predetermined light emission pattern.

4. The battery system of claim 1, wherein the abnormality detection mechanism is configured to continuously monitor the light emission detected by the photodetector device while the battery is being charged.

5. The battery system of claim 1, wherein the abnormality detection mechanism is further configured to intermittently monitor the light emission detected by the photodetector device while the battery is being discharged.

6. The battery system of claim 1, wherein the exterior member comprises an electrode portion of the battery, and wherein the luminescent layer is not formed on the electrode portion.

7. The battery system of claim 1, wherein the photodetector device is positioned to face the luminescent layer.

8. The battery system of claim 1, wherein the photodetector device has a form that corresponds to a form of a surface of the luminescent layer.

9. The battery system of claim 1, wherein the battery is a vehicle battery configured to mount in a vehicle.

10. The battery system of claim 1, wherein the stress luminescent material comprises strontium aluminate containing europium.

11. The battery system of claim 1, wherein the abnormality detection mechanism is further configured to intermittently monitor the light emission at a frequency determined based on a charging or discharging rate of the battery.

12. A method for a battery system, the method comprising:
    detecting, by a photodetector device, light emission from a luminescent layer on a surface of a battery, wherein the luminescent layer comprises a stress luminescent material configured to emit light in response to application of mechanical stress; and
    monitoring, by an abnormality detection mechanism, the detected light emission; and
    detecting, by the abnormality detection mechanism, an abnormal state of the battery based on the monitoring.

13. The method of claim 12, wherein the detecting comprises comparing the detected light emission to a predetermined light emission pattern of the stress luminescent material.

14. The method of claim 12, wherein the detecting comprises comparing the detected light emission to a predetermined light emission pattern of the stress luminescent material, the method further comprising determining existence of the abnormal state of the battery in response to the detected light emission substantially matching the predetermined light emission pattern.

15. The method of claim 12, wherein the monitoring comprises continuously monitoring the detected light emission while the battery is being charged.

16. The method of claim 12, wherein the monitoring comprises intermittently monitoring the detected light emission while the battery is being discharged.

17. The method of claim 12, wherein the monitoring further comprises intermittently monitoring detected light emissions at a frequency determined based on a discharging rate of the battery.

18. The method of claim 12, wherein the monitoring further comprises intermittently monitoring detected light emissions at a frequency determined based on a charging rate of the battery.

19. A battery system comprising:
    a battery comprising a stress luminescent material on a surface thereof, wherein the stress luminescent material is configured to emit light in response to application of mechanical stress;
    a photodetector device configured to detect light emission by the stress luminescent material; and
    an abnormality detection mechanism configured to intermittently monitor the light emission detected by the photodetector device during discharge of the battery, and to detect an abnormality of the battery based on the monitored light emission.

20. The battery system of claim 19, wherein the abnormality detection mechanism is further configured to monitor the light emission at a frequency based on a discharge rate of the battery.

* * * * *